United States Patent
Pelc

[11] 3,979,643
[45] Sept. 7, 1976

[54] LOGIC DRIVER CIRCUIT WITH OUTPUT PROTECTION

[75] Inventor: Rafael Pelc, Rochester, Minn.

[73] Assignee: International Business Machines Corporation, Armonk, N.Y.

[22] Filed: Feb. 3, 1975

[21] Appl. No.: 546,486

[52] U.S. Cl.............................. 317/16; 317/33 R; 330/207 P
[51] Int. Cl.²......................................... H02H 7/20
[58] Field of Search......... 317/16, 33 R, 31, 33 VR; 307/202 R, 203, 214; 328/91, 92; 330/207 P

[56] References Cited
UNITED STATES PATENTS

| | | |
|---|---|---|
| 3,109,980 | 11/1963 | Wiley............................ 307/202 R |
| 3,447,035 | 5/1969 | Boykin......................... 317/33 R X |
| 3,509,423 | 4/1970 | Czerny................................... 317/16 |
| 3,585,514 | 6/1971 | Kubicz............................. 330/207 P |
| 3,714,512 | 1/1973 | Grabowski..................... 317/33 VR |
| 3,753,079 | 8/1973 | Trilling....................... 317/33 VR X |
| 3,786,364 | 1/1974 | Wheatley, Jr.............. 307/202 R X |

*Primary Examiner*—J D Miller
*Assistant Examiner*—Patrick R. Salce
*Attorney, Agent, or Firm*—J. Michael Anglin

[57] ABSTRACT

A resistor senses low-level drive current is a logic circuit. When the output is shorted, excessive drive current turns on a sensor transistor, which causes drive voltage to the output stage to be clamped to ground, and to remain clamped until the fault is removed.

6 Claims, 2 Drawing Figures

LOGIC DRIVER CIRCUIT WITH OUTPUT PROTECTION

BACKGROUND

The present invention relates to electrical circuits, and specifically concerns drivers for producing high-current signals from low-level logic inputs.

Driver circuits are commonly used to increase the level of binary logic signals for driving long lines or multiple loads. Frequently, a removable plug is inserted between the driver output and the loads which it drives. In such applications, there is always a significant possibility that the driver output may become accidentally shorted during handling or testing. Unless such fault conditions are provided for, the driver will burn out from excessive power dissipation.

Common practice in the past has been to select an output transistor with a sufficiently high power rating to withstand accidental short circuits across the driver-circuit output terminals. Since the short-circuit dissipation is normally at least several times the normal full-load dissipation, this practice leads to increased cost and size. It usually requires, for example, that the output transistor be in a separate package from the remainder of the driver circuit. The art has recognized the broad concept of adding control circuitry to shut down an output transistor under overload conditions. But such circuitry has always sensed the output itself, which entails degradation of the output signal, complex sensor circuits, and/or imprecise dissipation control.

THE INVENTION

The present invention provides a simple logic driver which overcomes the disadvantages of previous approaches, and which can be entirely integrated into a single package. Broadly speaking, the invention senses a drive signal to an output stage, rather than sensing the high-level output signal directly. When excessive drive occurs, a control element removes the drive signal, thereby limiting dissipation in the output stage. The drive signal continues to be held off as long as a potentially high-dissipation fault condition remains.

The above and other objects and features of the invention, as well as modifications obvious to those skilled in the applicable arts, will become apparent from the following detailed description of a preferred embodiment, taken in conjunction with the accompanying drawings.

DRAWINGS

DESCRIPTION

Figure 1:
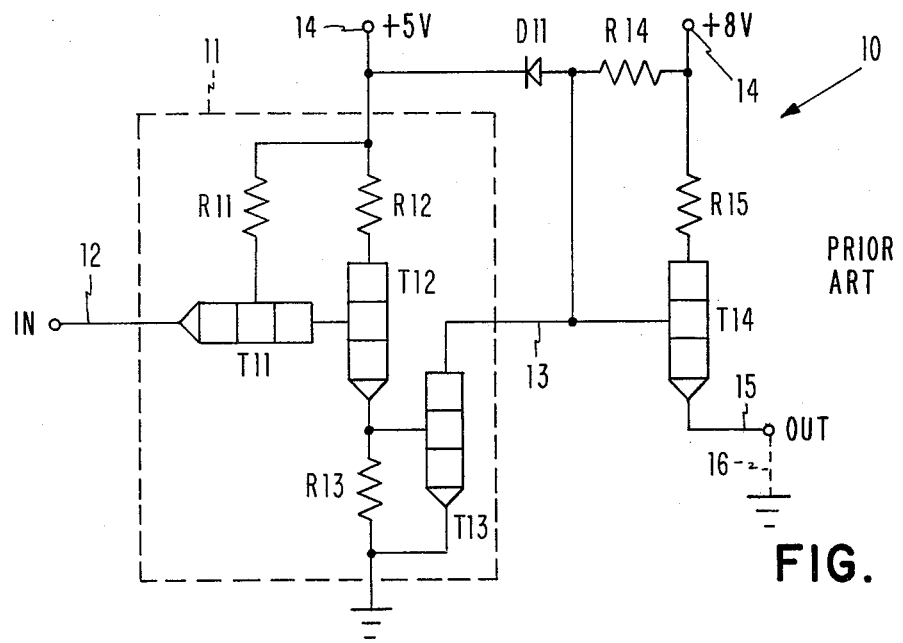
FIG. 1 shows a prior-art logic driver circuit useful in explaining the present invention.

FIG. 1 shows one common type of conventional logic-driver circuit, to provide a background for a description of a circuit according to the present invention. Block 11 represents an open-collector inverter having transistors T11-T13 and resistors R11-R13. Inverter 11, which may be a standard SN7405, receives a logic signal on input line 12, and produces an inverted drive signal on line 13. A +5 volt supply voltage is coupled to terminal 14. The open collector of transistor T13 is coupled to a higher (+8 volt) output power supply at 14 through resistor R14, but is clamped to the +5 volt supply by diode D11.

The driver signal on line 13 feeds the base of high-power output transistor T14, whose collector is tied to the +8 volt supply 14 through load resistor R15. The circuit output 15 is taken between the emitter of T14 and ground.

Circuit 10 is designed to drive other logic circuits which may be coupled to output 15 by relatively long wires, or through disconnectable plugs. Thus, the possibility exists that the emitter of T14 may become shorted directly to ground, as indicated by dotted line 16. The normal emitter current of T14 may be on the order of 70mA. But this current may rise to 160mA or more for a direct short to ground. To avoid burning out the circuit, T14 must be rated to handle the entire power dissipation from this higher current. For many applications, this requires the use of a transistor which is physically too large to be integrated in the same package as the remainder of the circuit.

Figure 2:
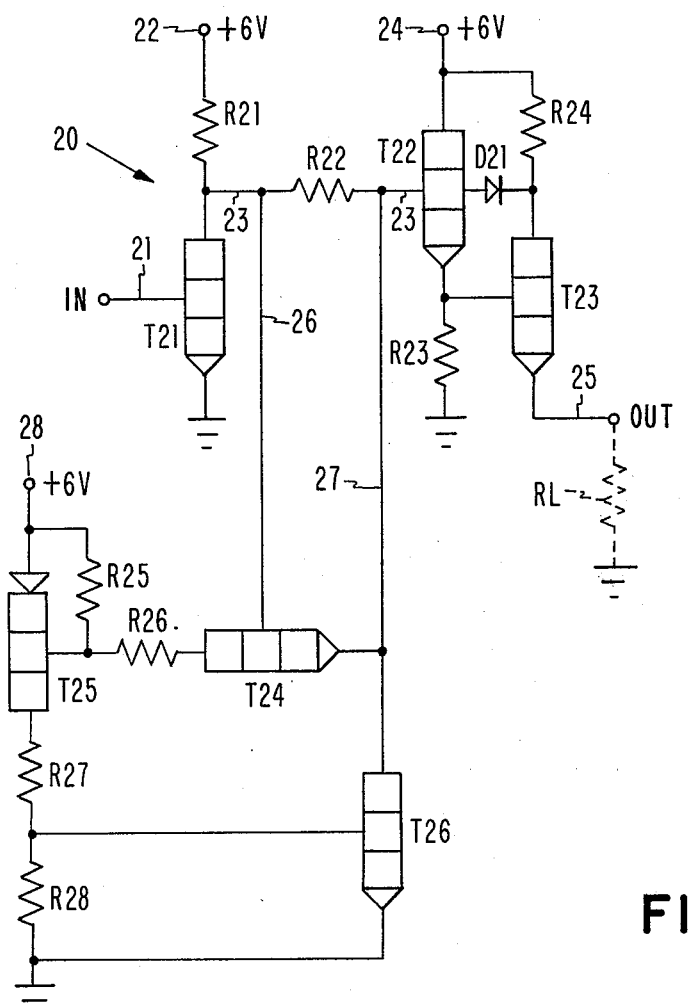
FIG. 2 is a schematic diagram of an embodiment of the present invention.

FIG. 2 shows a logic-driver circuit 20 according to the present invention. An input stage receives a logic signal from line 21 at the base of input transistor T21. Load resistor R21 is coupled between a positive voltage supply terminal 22 and the collector of T21. An inverted drive signal on drive line 23 is taken from the collector of T21. Input transistor T21 provides signal isolation and polarity inversion. In some cases, it may be possible to omit it and R21, and to receive a drive signal into circuit 20 directly on line 23.

The drive signal on line 23 proceeds through sensing resistor R22 to a high-level output stage. The base of driver transistor T22 receives the drive signal from line 23; its collector is coupled to a voltage supply at 24, which may be tied to terminal 22. The emitter of T22 is coupled to load resistor R23 and to the base of output transistor T23. Collector load resistor R24 is tied to supply terminal 24. Clamping diode D21 prevents the collector voltage of T23 from falling below the drive voltage at the base of T23 and thus maintains T23 out of the saturation region for fast turn-off switching. The powered output signal of circuit 20 is taken on line 25, from the emitter of T23.

Sensor resistor R22 provides a control voltage between lines 26 and 27 proportional to the amount of drive current flowing in line 23. During normal operation of circuit 20, this control voltage is relatively low. When the input signal on line 21 is near the supply voltage (logic "1"), T21 is forward biased, and T22 and T23 are cut off. Only a leakage current from T22 flows through R22 under this condition. When the input signal is near ground (logic "0"), T21 is cut off, T22 is forward biased through R21, and T23 is forward biased by the voltage across R23. For this latter condition, the drive current in line 23 is limited principally by R21 and the equivalent load resistance RL of a circuit (not shown) connected to output line 25.

Sensor transistor T24 is biased off under the above normal conditions. But, when RL decreases to a value which would produce an excessive dissipation in high-level output transistor T23, the increased drive current in line 23 produces a voltage between lines 26 and 27 sufficient to forward bias T24 (about 0.6 volt for a silicon transistor). This condition causes T24 to conduct current from supply 28 through resistors R25 and R26, and thence to ground through the forward-biased base-emitter diodes of T22 and T23, and the load resistance (or short circuit) RL. The resultant voltage drop through R25 is sufficient to turn on normally-off latch transistor T25, allowing a current to flow through resistors R27 and R28. The voltage across R28 then appears between the base and emitter of control transistor T26, causing it to conduct current from the base of driver transistor T22 to ground. This low-impedance path through T26 removes the drive signal from T22, which cuts off T22 and T23, thereby immediately eliminating the high-dissipation fault condition in T23. That is, drive line 23 is effectively decoupled from T22, since the drive current is shunted to ground. Supply 28 may be directly connected to supply 22 or 24, if desired.

Besides removing drive from the output stage, control transistor T26 provides a path to ground for the emitter of T24. Therefore, as long as excessive drive current flows through R22, transistors T24-T26 maintain each other in a conducting state. Removal of the fault condition across output 25, however, causes the drive current to decrease if the input signal is at logic 1, cutting off T24-T26 and returning immediately to normal operation. A transition of the input signal from logic 0 to logic 1 also turns off T24-T26 in the control circuit, whether or not a fault condition exists at output 25; this is acceptable since no excessive dissipation would occur in T23 for this input-signal condition. But, if the input signal should return to logic 0 while a fault exists across the output, the control circuit would again turn on immediately, so as to remove the drive from the output stage.

Typical values for the resistances in circuit 20 may be as follows: R21=1.5 kohms, R22=500 ohms, R23=3 kohms, R24=30 ohms, R25=1.5 kohms, R26=2 kohms, R27=5 kohms, and R28=2 kohms. Transistors T21-T24 and T26 are NPN integrated-circuit transistors, while T25 may be a lateral PNP type, integrated on the same chip. T23 may be designed for an output (emitter) current of about 60 ma., for a supply voltage at terminals 22, 24 and 28 of +6 volts.

Limiting the dissipation in output transistor T23 allows it to be integrated along with the remainder of circuit 20. Sensing the low-level drive signal, instead of the high-level output, allows dissipation to be limited without adding further heat caused by an output-current sensing element, and without degrading the characteristics of the output signal with series or shunt elements. Circuit 20 operates by sensing drive current and clamping the drive voltage to ground. Other methods of drive removal under fault conditions within the scope of the invention will also occur to those skilled in the art.

Having described one embodiment thereof, I claim as my invention:

1. A driver for increasing the level of a logic signal, said driver comprising:
   an input circuit responsive to a low-level input logic signal for producing drive current on a drive line;
   an output circuit coupled to said drive line for producing a voltage indicative of said drive current;
   a sensor transistor having a base and an emitter coupled across said resistor and adapted to conduct when said drive current exceeds a predetermined amount;
   a control transistor coupled to said sensor transistor and to said drive line and adapted to conduct when said sensor transistor conducts, so as to shunt said drive current away from said output circuit for cutting off said output circuit when said drive current exceeds said predetermined amount; and
   a latch transistor coupled to said sensor and to said control transistor but separate from said output circuit, for maintaining conduction of said contol transistor as long as said low-level input signal is present.

2. A driver according to claim 1, wherein said latch transistor has a base, a collector and an emitter, said emitter being coupled to a supply potential; wherein said sensor transistor has a collector coupled to said latch-transistor base; and wherein said control transistor has a collector coupled to said drive line and to said sensor-transistor emitter, a base coupled to said latch-transistor collector, and an emitter coupled to a ground potential.

3. A driver for producing a high-level logic output signal from a low-level logic input signal, said driver comprising:
   an output circuit for producing said high-level output signal;
   a drive line coupling said low-level input signal to said output circuit;
   sensing means coupled to said drive line for detecting an excessive drive signal in said drive line;
   control means coupled to said sensing means and to said drive line for decoupling said drive line from said output circuit so as to render said output circuit non-conductive when said excessive drive signal is present; and
   latch means coupled to said sensing means for maintaining said excessive drive signal independently of said output circuit.

4. A driver according to claim 3, wherein said sensing means is adapted to detect a predetermined amount of current flowing in said drive line.

5. A driver according to claim 4, wherein said output circuit includes an emitter-follower transistor having a base responsive to said drive signal and an emitter coupled in series with a load means.

6. A driver according to claim 3, wherein said control means is adapted to decouple said drive line by shunting said drive current to a ground potential.

* * * * *